(12) United States Patent
Kudo

(10) Patent No.: US 6,265,909 B1
(45) Date of Patent: Jul. 24, 2001

(54) THREE-VALUED SWITCHING CIRCUIT

(75) Inventor: Hiroshi Kudo, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/464,038

(22) Filed: Dec. 15, 1999

(30) Foreign Application Priority Data

Dec. 15, 1998 (JP) .................................. 10-355856
Sep. 2, 1999 (JP) .................................. 11-248175

(51) Int. Cl.$^7$ .............................. H03K 5/153; H03K 5/22
(52) U.S. Cl. ................................. 327/77; 327/81
(58) Field of Search .................... 327/52, 53, 56, 327/63, 65, 66, 72, 77–82, 88, 89, 90, 374, 432, 478, 479, 480, 489, 490; 330/252, 253, 300

(56) References Cited

U.S. PATENT DOCUMENTS

| | | | |
|---|---|---|---|
| 4,339,674 | * | 7/1982 | Hashimoto ............................. 327/77 |
| 4,951,003 | * | 8/1990 | De Jager et al. ..................... 330/252 |
| 5,021,744 | * | 6/1991 | Van De Plassche ................. 330/252 |
| 5,113,146 | * | 5/1992 | De Jager et al. ..................... 330/252 |
| 5,721,507 | * | 2/1998 | Fujii et al. ............................ 327/354 |
| 5,896,051 | * | 4/1999 | Umeda et al. ......................... 327/77 |

FOREIGN PATENT DOCUMENTS 2-6684    2/1990    (JP) .

\* cited by examiner

Primary Examiner—My-Trang Nu Ton
(74) Attorney, Agent, or Firm—Scully, Scott, Murphy & Presser

(57) ABSTRACT

A three-valued switching circuit having one control input terminal and one output terminal and including at least two transistors constituting a differential pair, and one constant current source connected to a common emitter terminal of the at least two transistors, in which a collector of one of said at least two transistors is connected to said output terminal to output three kinds of current values from said output terminal in response to a three-valued logic control signal applied to said control input terminal.

13 Claims, 12 Drawing Sheets

$VBE1 = VT \ln(IC1/IS)$ $VT = \dfrac{KT}{q} \doteq 25mV @ 300K$

IS : PN JUNCTION SATURATION CURRENT $\begin{bmatrix} \text{ONE TRANSISTOR} & \text{IS} \\ \text{TWO TRANSISTORS} & \text{2IS} \end{bmatrix}$

| CONTROL INPUT TERMINAL | OUTPUT CURRENT ISW |
|---|---|
| L(VB3=0V) | 4/4IO(=IC1) |
| H (VB3≧VREF+100mV) | 2/4IO(=IC2) |
| HIZ(OPEN) (VB3=VREF) | 3/4IO(=IC1+IC2) |

| INPUT VOLTAGE VIN | OUTPUT CURRENT ISW |
|---|---|
| L | IO |
| H | $\frac{m}{h+m} \times IO$ |
| HIZ | $\frac{m+n}{h+m+n} \times IO$ |

| INPUT VOLTAGE VIN | OUTPUT CURRENT ISW |
|---|---|
| L | $\frac{m}{h+m} \times IO$* |
| H | $IO$ * |
| HIZ | $\frac{m+n}{h+m+n} \times IO$ |

OPERATION CONDITION
  $h+m=n$
  $R1=R2, I1=I2$
  $VIN=VREF$ $h, m, n$ : TRANSISTOR AREA RATIO

*INVERSION OF INPUT-OUTPUT CHARACTERISTICS IN NPN TRANSISTOR STRUCTURE SHOWN IN FIG. 11

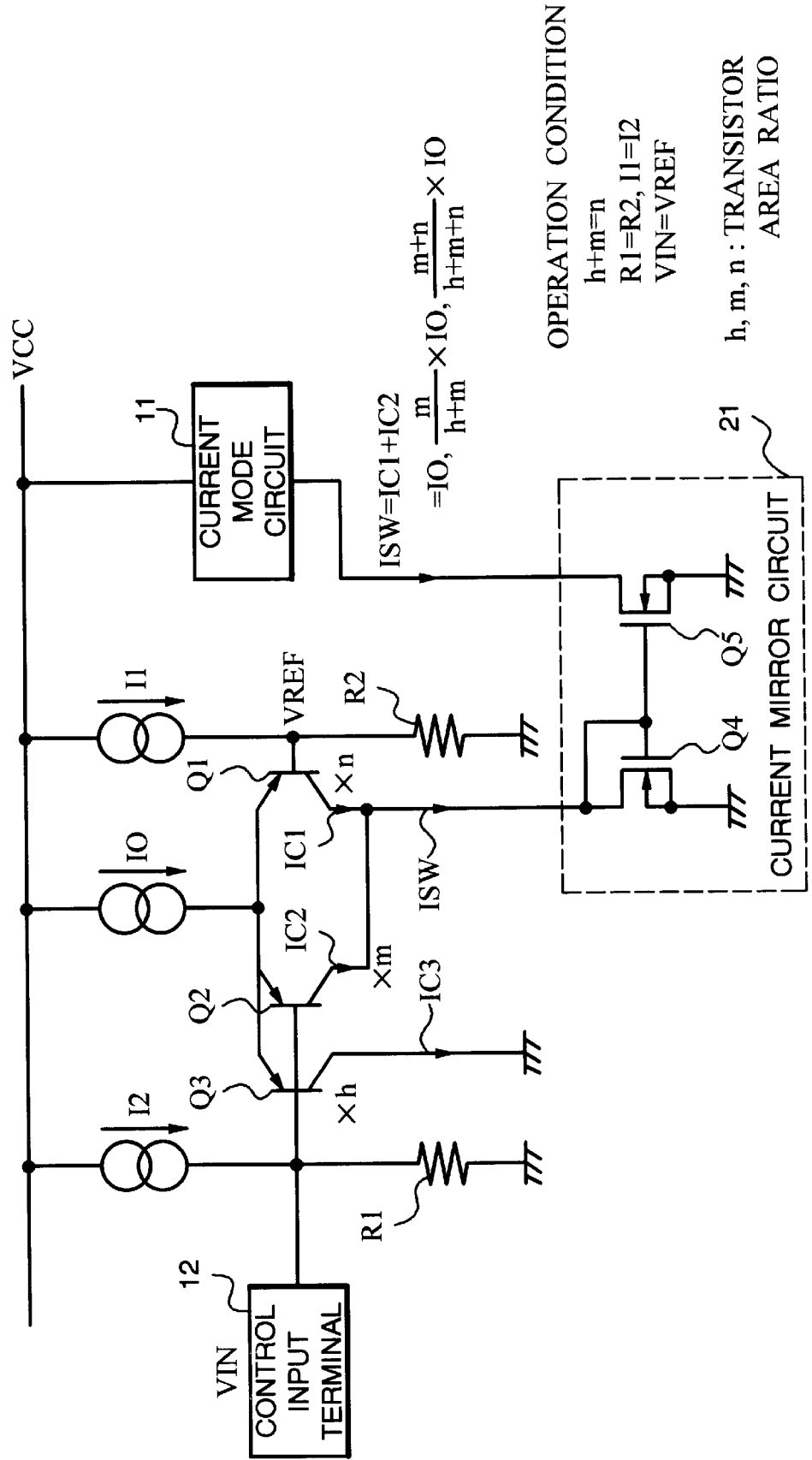

THREE-VALUED SWITCHING CIRCUIT

BACKGROUND OF THE INVENTION

1. Field of the Invention

The present invention relates to a three-valued switching circuit having one input terminal and one output terminal to obtain output with three kinds of current values from one output terminal.

2. Description of the Related Art

With reference to FIG. 17, a conventional current switching circuit will be described. In FIG. 17, the current switching circuit includes two current sources 92 and 93 connected to a current mode circuit 91, and switches SW1 and SW2 for switching these current sources 92 and 93. The current sources 92 and 93 have current values of IO and IO/2, respectively. To a control input terminal 94, a low level or high level control input signal is applied. This control input signal is supplied, as a switching signal of the switches SW1 and SW2, through an inverter 95 to the switch SW2 and further through an inverter 96 to the switch SW1.

The current switching circuit is structured to have two current sources to be switched by the switches SW1 and SW2 for attaining different electrical characteristics by changing a current value of the current mode circuit 91. More specifically, one of the two current sources 92 and 93 can be selected by selecting the switch SW1 or the switch SW2 in response to one control input signal at a logical high or low level.

The above-described current switching circuit, however, requires current sources and switches to be prepared as many as the number of current values to be varied.

On the other hand, a three-valued logic circuit enabling one current source to have three kinds of output is known (e.g. Utility Model Laying-Open No. 2-6684). In the three-valued logic circuit, output is allotted to one of three output terminals according to three kinds of potentials applied to an input terminal and three output terminals are accordingly needed. Output currents of the three output terminals are the same.

SUMMARY OF THE INVENTION

An object of the present invention is to provide a three-valued switching circuit enabling output with three kinds of current values to be taken out by a logical value signal applied to one control input terminal.

Other object of the present invention is to realize simplification of bias setting of a switching circuit.

According to one aspect of the invention, a three-valued switching circuit, comprises
one control input terminal and one output terminal,
at least two transistors constituting a differential pair, and
one constant current source connected to a common emitter terminal of the at least two transistors, wherein
a collector of one of the at least two transistors is connected to the output terminal to output three kinds of current values from the output terminal in response to a three-valued logic control signal applied to the control input terminal.

In the preferred construction, when a current value of the constant current source is IO, the three kinds of current values take one of IO, (1/2)·IO and 0.

In another preferred construction, a current mirror circuit is connected at the output side to reflect an output current and supply the current to a current mode circuit connected to a terminal of a power source.

In another preferred construction, when a current value of the constant current source is IO, the three kinds of current values take one of IO, (1/2)·IO and 0, and a current mirror circuit is connected at the output side to reflect an output current and supply the current to a current mode circuit connected to a terminal of a power source.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, and a collector of the one transistor and a collector of the additional transistor are commonly connected to the output terminal.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, a collector of the one transistor and a collector of the additional transistor are commonly connected to the output terminal, and a current mirror circuit is connected at the output side to reflect an output current and supply the current to a current mode circuit connected to a terminal of a power source.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, a collector of the one transistor and a collector of the additional transistor are commonly connected to the output terminal, and when a current value of the constant current source is IO, the three kinds of current values take one of IO, (3/4)·IO and (1/2)·IO.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, a collector of the one transistor and a collector of the additional transistor are commonly connected to the output terminal, a current mirror circuit is connected at the output side to reflect an output current and supply the current to a current mode circuit connected to a terminal of a power source, and when a current value of the constant current source is IO, the three kinds of current values take one of IO, (3/4)·IO and (1/2)·IO.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, a collector of the one transistor and a collector of the additional transistor are commonly connected to the output terminal, and a transistor ratio of the three transistors is arbitrarily changed like A: B: C: (A, B and C are integers) to take out an output current value.

In another preferred construction, one transistor is added to the two transistors constituting a differential pair to make three-transistor structure, all emitters of the three transistors are connected to the constant current source, the other of the two transistors and the additional transistor have bases commonly connected to the control input terminal, a base of one of the two transistors is connected to a reference voltage source, a collector of the one transistor and a collector of the additional transistor are commonly connected to the output terminal, a current mirror circuit is connected at the output side to reflect an output current and supply the current to a current mode circuit connected to a terminal of a power source, and a transistor ratio of the three transistors is arbitrarily changed like A: B: C: (A, B and C are integers) to take out an output current value.

In another preferred construction, a third transistor Q2 is added to the first and second transistors constituting a differential pair to make three-transistor structure, all emitters of the three transistors are connected to the constant current source, the first or second transistor and the third transistor have bases commonly connected to the control input terminal, a base of one of the first and second transistors is connected to a reference voltage source, a collector of the first or second transistor and a collector of the third transistor are commonly connected to the output terminal, and an area ratio of the third, second and first transistors represented as h:m:n is set to have a relationship of h+m=n.

In another preferred construction, a third transistor Q2 is added to the first and second transistors constituting a differential pair to make three-transistor structure, all emitters of the three transistors are connected to the constant current source, the first or second transistor and the third transistor have bases commonly connected to the control input terminal, a base of one of the first and second transistors is connected to a reference voltage source, a collector of the first or second transistor and a collector of the third transistor are commonly connected to the output terminal, an area ratio of the third, second and first transistors represented as h:m:n is set to have a relationship of h+m=n, and an input voltage to the control input terminal and a bias voltage value of the reference voltage source are set to be equal.

Also, a third transistor Q2 is added to the first and second transistors constituting a differential pair to make three-transistor structure, all emitters of the three transistors are connected to the constant current source, the first or second transistor and the third transistor have bases commonly connected to the control input terminal, a base of one of the first and second transistors is connected to a reference voltage source, a collector of the first or second transistor and a collector of the third transistor are commonly connected to the output terminal, an area ratio of the third, second and first transistors represented as h:m:n is set to have a relationship of h+m=n, and a current mirror circuit is connected at the output side to reflect an output current and supply the current to a current mode circuit connected to a power source VCC terminal.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 16 is a circuit diagram showing an example of a variation of the circuit illustrated in FIG. 14;

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

According to the present invention, a switching circuit is composed of one constant current source and input of three logic modes is applied to one control input terminal to have three kinds of current values output from one output terminal, which structure makes a circuit excellent in function efficiency and integration efficiency.

More specifically, the three-valued switching circuit according to the present invention is a voltage-controlled current output circuit which is characterized in that with one control input terminal and one output terminal, application of a three-valued logic control signal to the control input terminal attains three kinds of current values at the output terminal according to an input logical value and which has structure in which an output current is allowed to divide a value of one current source constituting the three-valued switching circuit.

In particular, in another mode of the above-described circuit, an area ratio h:m:n of three differential pair transistors constituting the present switching circuit is conditioned to be h+m=n to realize simplification of bias setting of the switching circuit.

Figure 1:
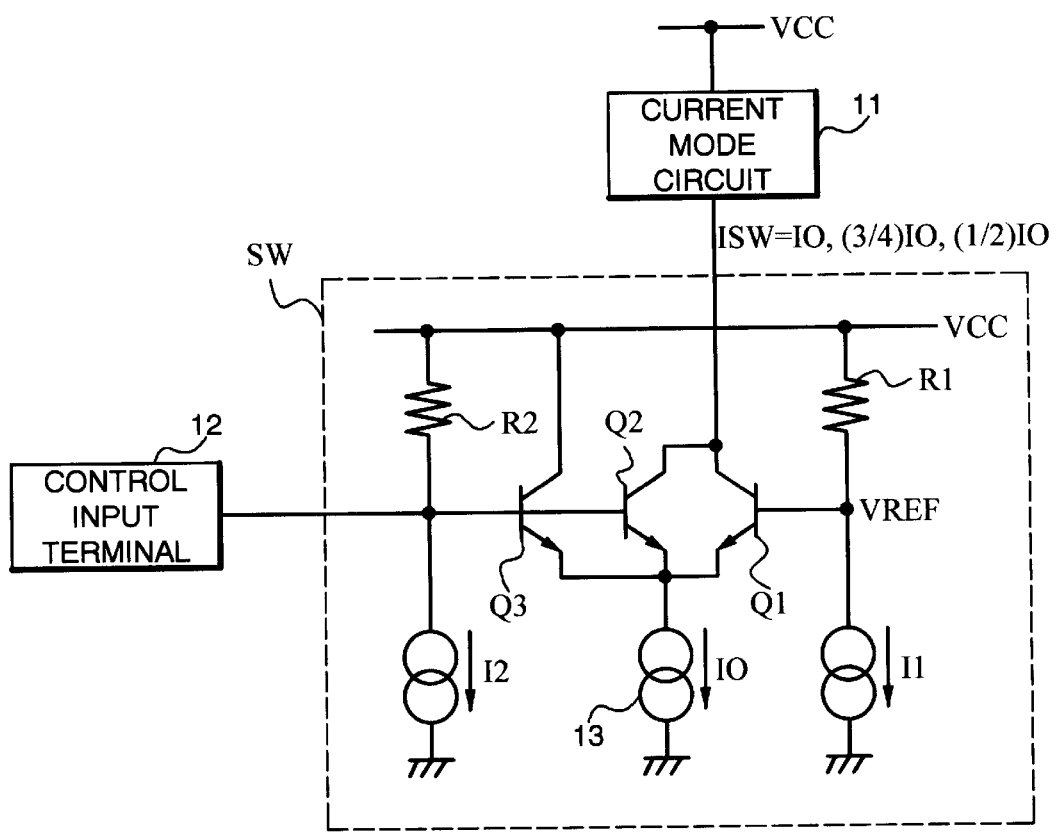
FIG. 1 is a circuit diagram showing structure of a first embodiment of the present invention.

Basic structure of a three-valued switching circuit (hereinafter referred to as a switching circuit) according to a first embodiment of the present invention is shown in FIG. 1. In FIG. 1, this switching circuit SW is structured to have characteristics varied by setting a current value ISW of a current mode circuit 11 to be variable. The switching circuit SW therefore includes one control input terminal 12, one output terminal, three transistors Q1, Q2 and Q3 and a constant current source 13. The circuit is designed to have three logical values, low level L, high level H and open HIZ applied to the control input terminal 12 and have a current output from the output terminal at a ratio of IO, (1/2)·IO, (1/4)·IO, with a current value IO of the constant current source 13 as a reference.

It is assumed that three-valued logic as input is obtained from a three-state output buffer. Current sources assigned I1 and I2 are current sources for determining a bias of the transistors Q1 and Q3 and have a function different from that of the constant current source 13 for varying an output current. The output terminal is provided between a collector of the transistor Q1 and the current mode circuit 11.

Figure 2:
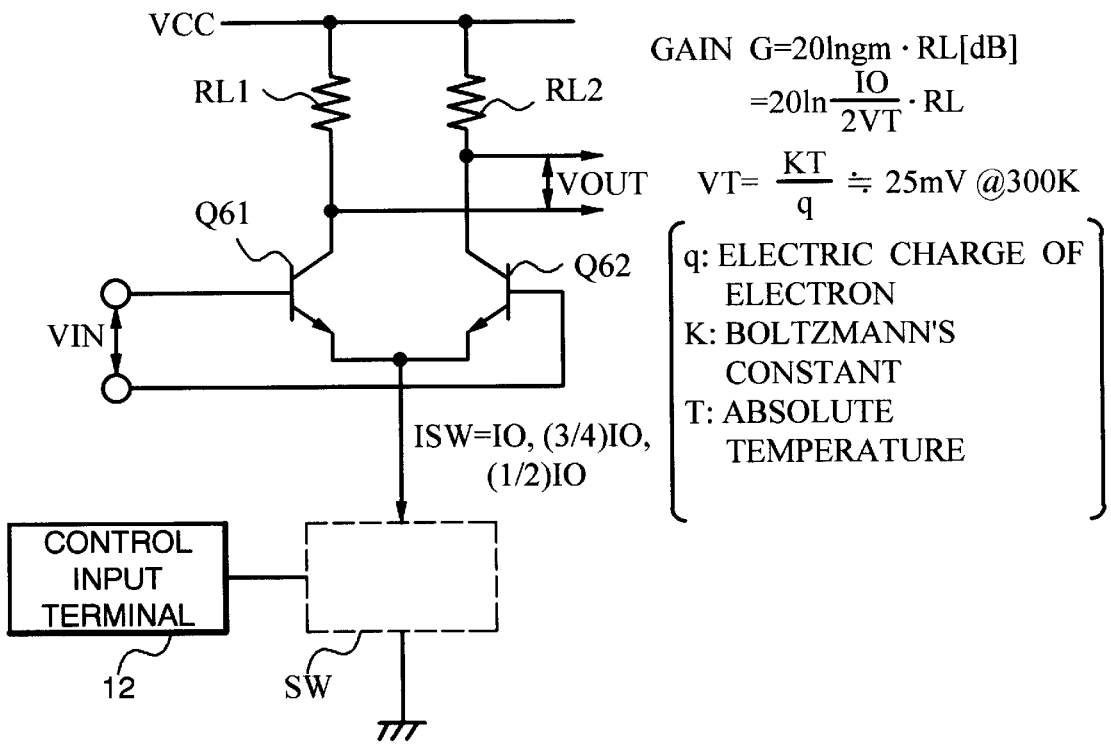
FIG. 2 is a circuit diagram showing an example of an application of the circuit shown in FIG. 1.

FIG. 2 shows an example of an application of FIG. 1 which is structured to vary a voltage gain by varying a current value of a differential pair amplifier composed of transistors Q61 and Q62.

Figure 3:
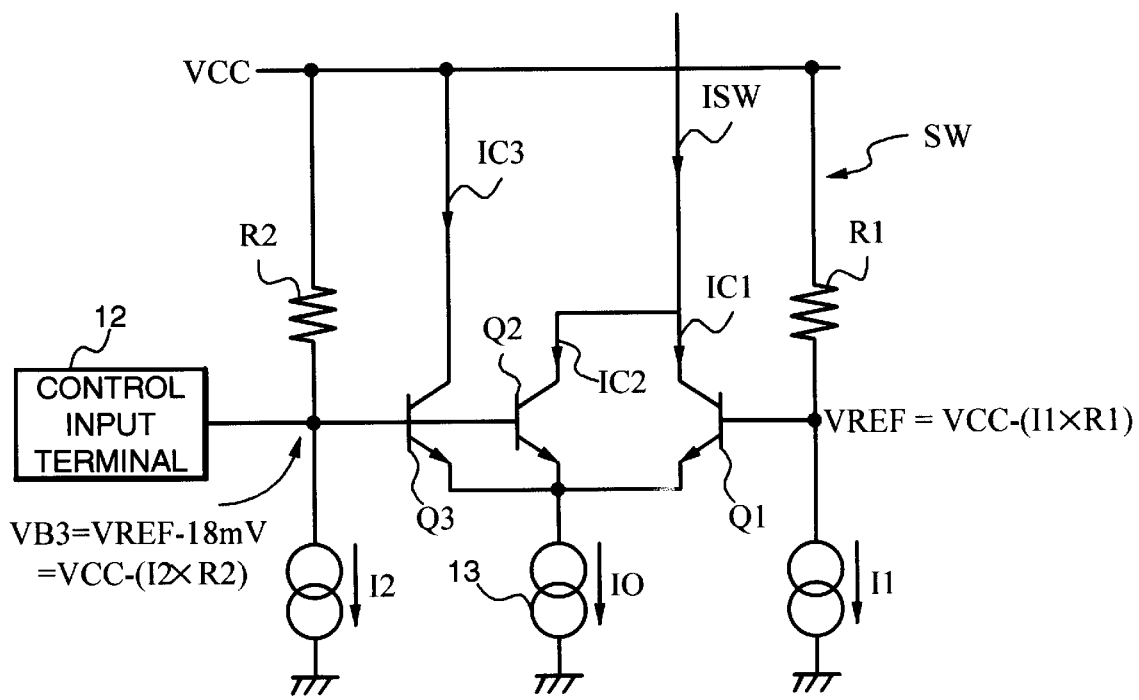
FIG. 3 is a diagram for use in explaining a function of a switching circuit shown in FIG. 1.

With reference to FIG. 3, operation of the switching circuit SW will be described. An output current ISW is expressed as ISW=IC1+IC2. Qualitative relationships among IC1, IC2 and IC3 will be described. IC1, IC2 and IC3 represent collector currents of the transistors Q1, Q2 and Q3, respectively.

As an uniform state of this switching circuit SW (in a case where a control input is at an open HIZ), a base voltage (reference voltage VREF) of the transistor Q1 and a base voltage of the transistors Q2 and Q3 (VB3) are set to have a relationship of VB3=VREF−18 (mV) such that IC1(=(1/2)·IO)=IC2(=(1/4)·IO)+IC3(=(1/4)·IO) is established. In other words, when a control input is at an open HIZ, an output current ISW=(3/4)·IO is obtained.

Next, when a high level H (≧VREF+100 mV) is applied as control input, only the transistor Q1 is turned off to have IC2=IC3=(1/2)·IO, whereby an output current ISW=(1/2)·IO is obtained.

Furthermore, when a low level L (≧VREF−100 mV) is applied as control input, the transistors Q2 and Q3 are turned off to have IC1=IO, whereby the output current ISW attains IO.

Thus, three kinds of current output are obtained from three-valued logic input.

Figure 4:
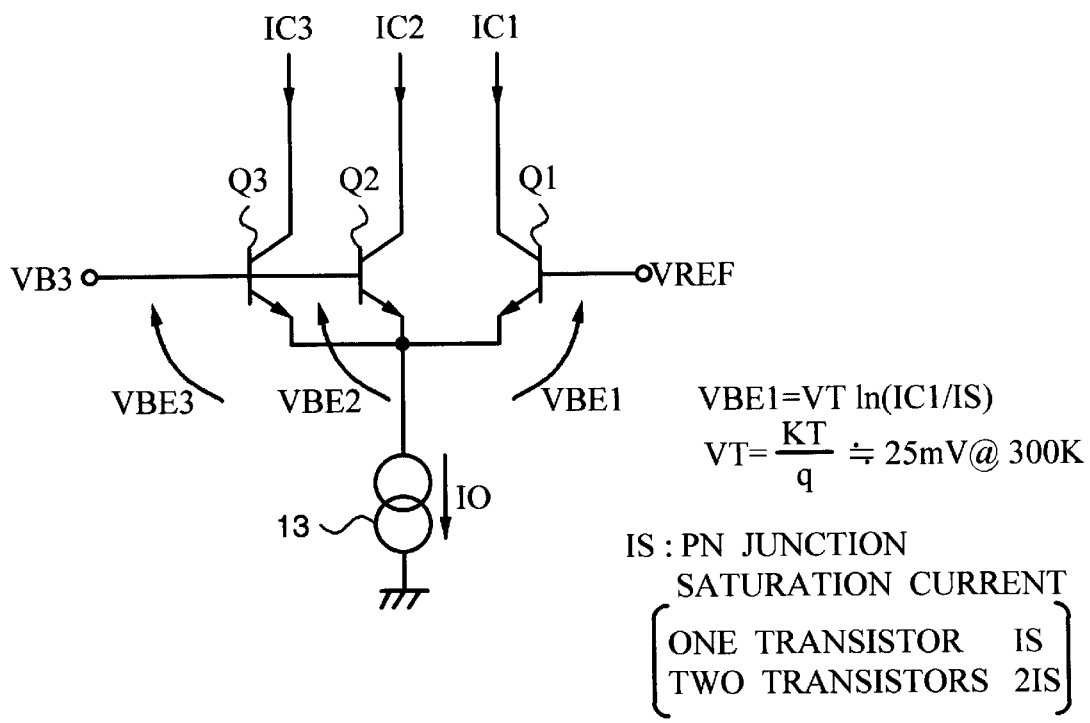
FIG. 4 is a diagram for use in explaining relationships between collector currents and base-emitter voltages of three transistors and between collector currents and a base voltage in FIG. 3.

Here, description will be made of relationships between collector currents IC1, IC2 and IC3 and base-emitter voltages VBE1, VBE2 and VBE3 of the transistors Q1, Q2 and Q3 and between the base voltage VB3 and VREF with reference to FIG. 4.

The reason why IC1=IC2=IC3 is established when a bias voltage is set to hold "VB3=VREF−18 (mV) is as follows.

Since the emitters of the transistors Q1, Q2 and Q3 are commonly connected to the constant current source 13 and the bases of the transistors Q2 and Q3 are common, the circuit is an unbalanced differential pair circuit constituted by the transistor Q1 and transistors Q2 and Q3 whose transistor ratio is 1:2.

Relationships among the base-emitter voltage VBE1 and the collector current IC1 of the transistor Q1, the base-emitter voltage VBE23 (VBE2=VBE3) and the collector current IC23 (=IC2+IC3) of the transistors (Q2, Q3) are expressed as follows.

$$VBE1 = VT \cdot \ln(IC1/IS) \quad (1)$$

$$VBE23 = VT \cdot \ln(IC23/2 \cdot IS) \quad (2)$$

A relationship between VBE1 and VBE23 where IC1=IC23 (=IC2+IC3) holds will be expressed as follows from the above expressions (1) and (2).

$$VBE23 = VBE1 - 18 \text{ (mV)} \quad (3)$$

It is understood from the expression (3) that for setting IC1=IC23 (=IC2+IC3), the base voltage VB3 of the transistors Q2 and Q3 should have bias setting to be 18 (mV) lower than the base voltage VREF of the transistor Q1.

In the above expressions, VT=KT/q (approximately 25 mV @ 300K) holds where K represents Lz Boltzmann's constant, T represents absolute temperature, q represents the amount of electric charges of electron and ln represents logarithm.

It is a well known characteristic that as an input dynamic range of the differential pair circuit, as long as a voltage difference not less than 4VT (100 mV) exists between the bias voltage VB3 and VREF, all the current value IO of the constant current source 13 flows to one of IC1 and IC23 (=IC2+IC3) and no current flows to the other as a collector current (e.g. "Semiconductor Circuit Design Technique, Nikkei-McGraw Hill, pp 254, 1st edition, Apr. 4, 1987).

When the bias voltage VB3 is not less than (VREF+100 mV), IC23 attains IO (IC2=IC3=IO/2) and IC1 attains 0. Setting a high level H of control input to be not less than (VREF+100 mV), the output current ISW attains (1/2)·IO from ISW=(IC1+IC2).

When the bias voltage VB3 is not more than (VREF−100 mV), the collector current IC23 attains 0 (IC2=IC3=0) and the collector current IC1 attains IO. Setting a low level L of the control input to be not more than (VREF−100 mV), the output current ISW attains IO.

Figure 5:
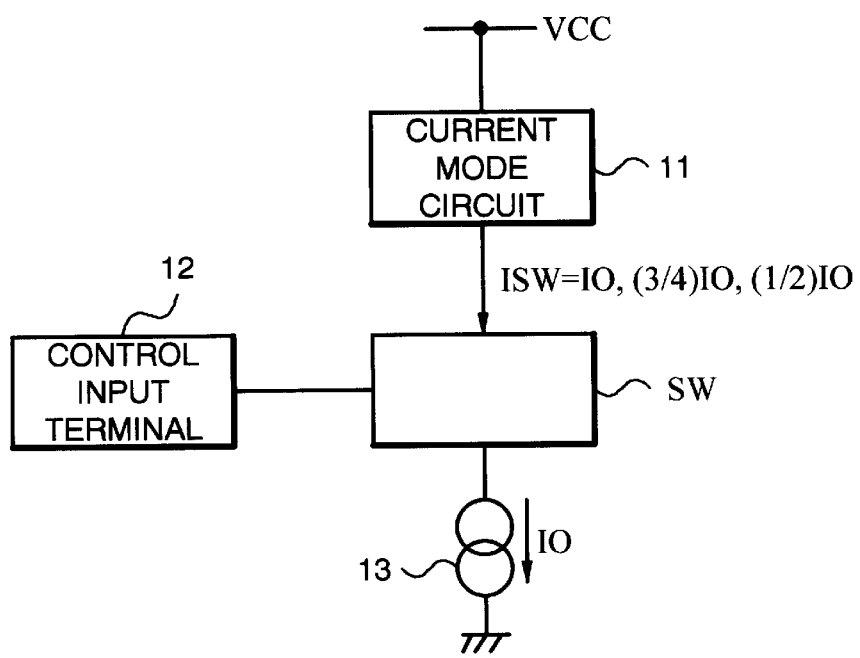
FIG. 5 is an equivalent circuit of FIG. 1.

FIG. 5 shows an equivalent circuit of the circuit shown in FIG. 1.

Figure 6:
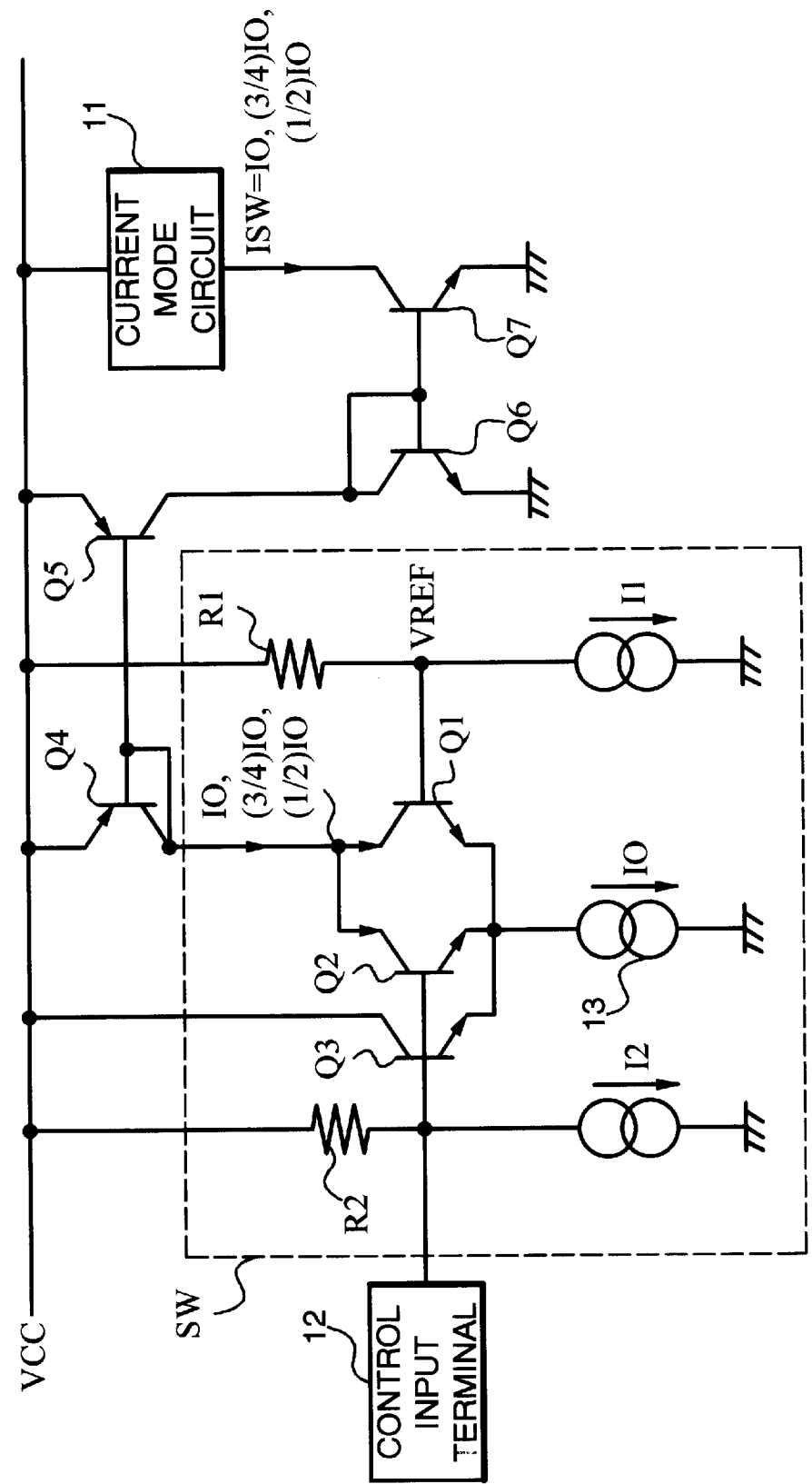
FIG. 6 is a circuit diagram showing structure of a second embodiment of the present invention.

With reference to FIG. 6, a second embodiment of the present invention will be described. The present embodiment differs from the embodiment shown in FIG. 1 in that it is structured to have an output current reflected at a current mirror circuit composed of transistors Q4–Q7 and supplied to the current mode circuit 11 connected to a terminal of the power source VCC. The present embodiment is characterized in that the current mode circuit 11 can be operated at a lower voltage than that in the structure of FIG. 1.

Figure 7:
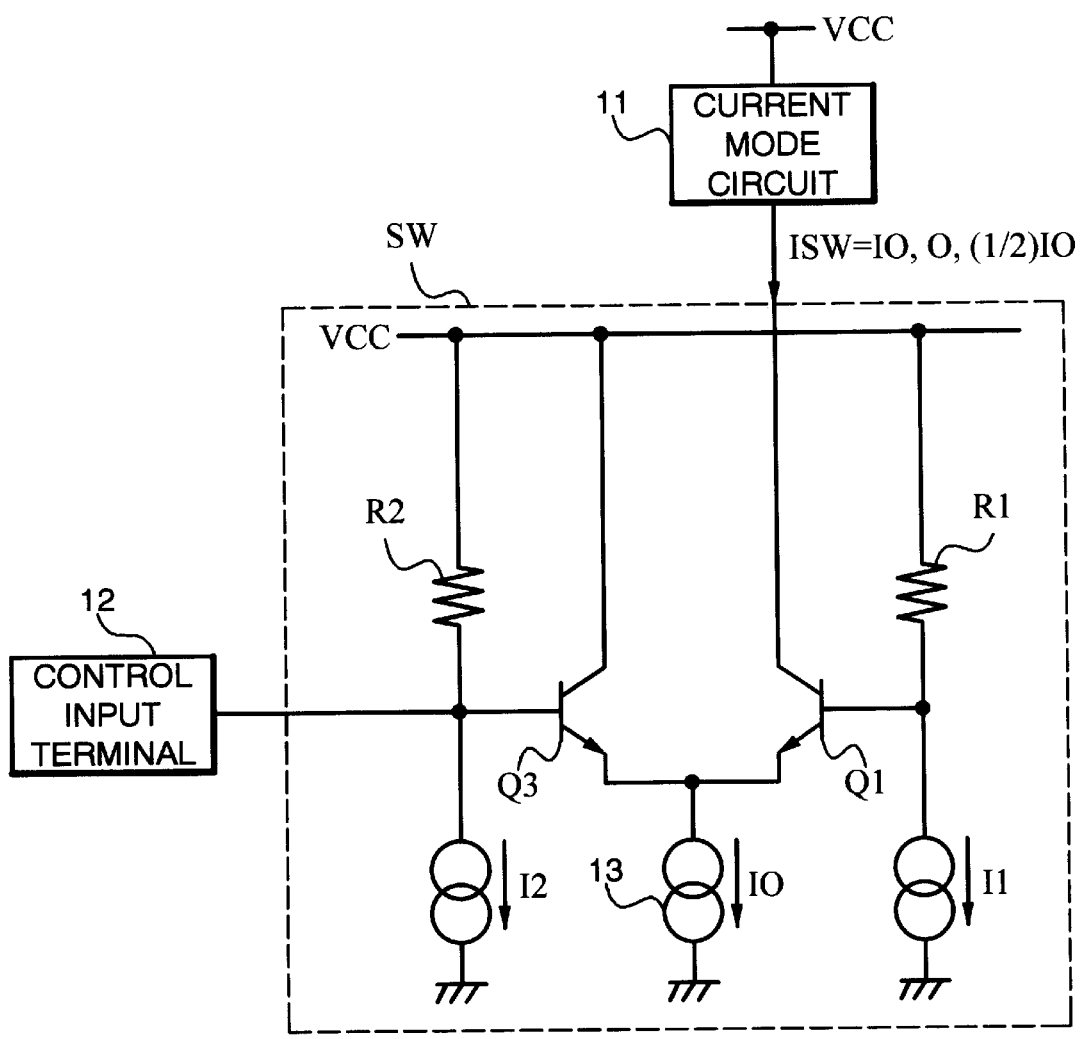
FIG. 7 is a circuit diagram showing structure of a third embodiment of the present invention.

With reference to FIG. 7, a third embodiment of the present invention will be described. The transistor structure shown in FIG. 1 has a transistor ratio Q1:Q2:Q3 of 1:1:1, while the present embodiment has a transistor ratio Q1:Q2:Q3 of 1:0:1. In other words, the transistor Q2 in the switching circuit SW in FIG. 1 is omitted. As a result, the present embodiment has characteristics that as output currents ISW, three kinds, IO (control input: low level L), (1/2)·IO (control input: open HIZ) and 0 (control input: high level H) are obtained according to input logic and a 0 current mode when no current is supplied to the circuit can be used as a stand-by mode.

Figure 8:
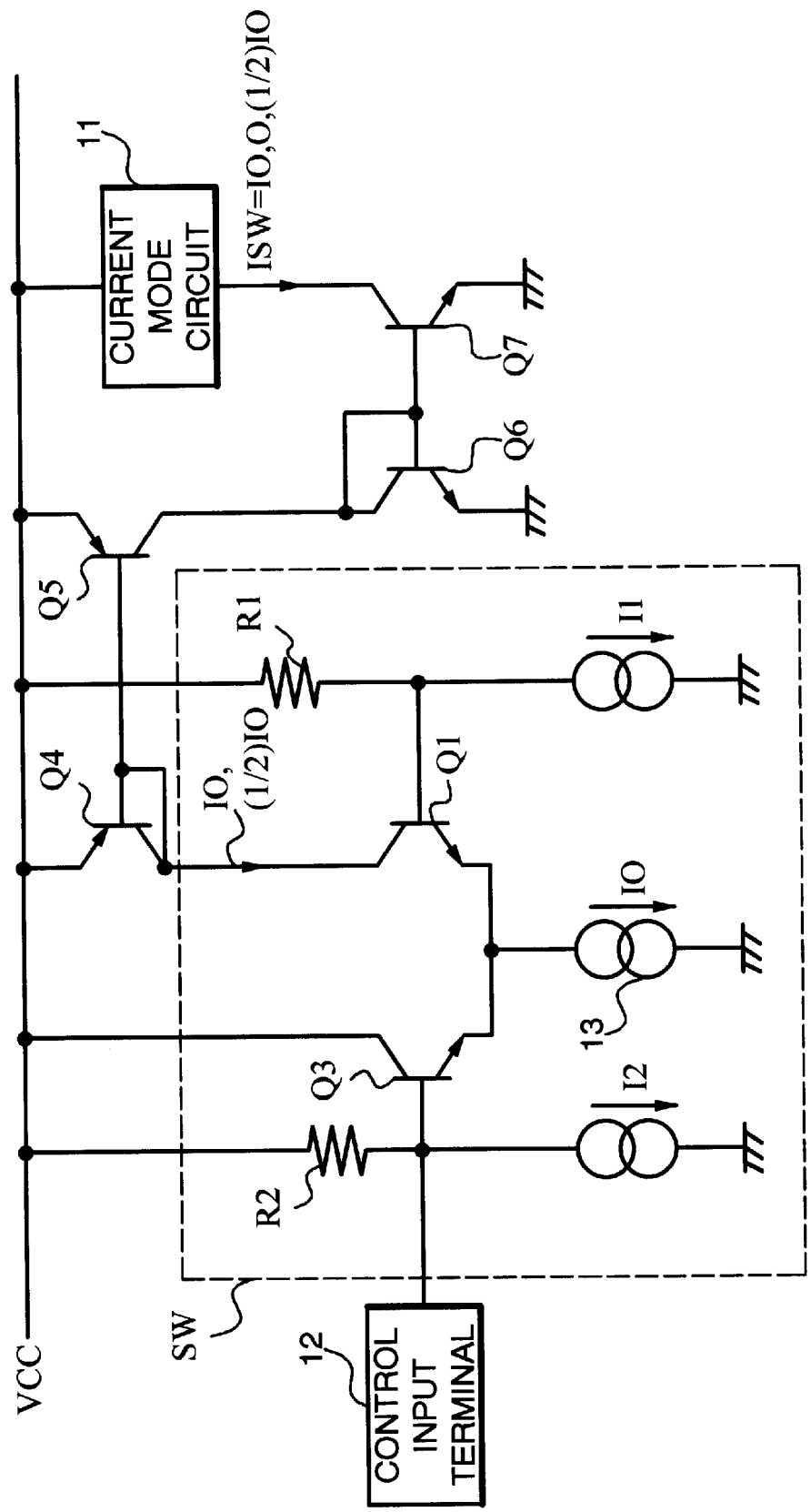
FIG. 8 is a circuit diagram showing structure of a fourth embodiment of the present invention.

With reference to FIG. 8, a fourth embodiment of the present invention will be described. The present embodiment is an example obtaining by combining the current mirror circuit of FIG. 6 with the switching circuit of FIG. 7. In other words, the present embodiment is structured to have an output current reflected at the current mirror circuit composed of the transistors Q4–Q7 and supplied to the current mode circuit 11 and have the transistor Q2 at the switching circuit SW of FIG. 6 omitted. As a result, as output currents ISW, three kinds, IO (control input: low level L), (1/2)·IO (control input: open HIZ) and 0 (control input: high level H) are obtained according to input logic.

Figures 9, 10:
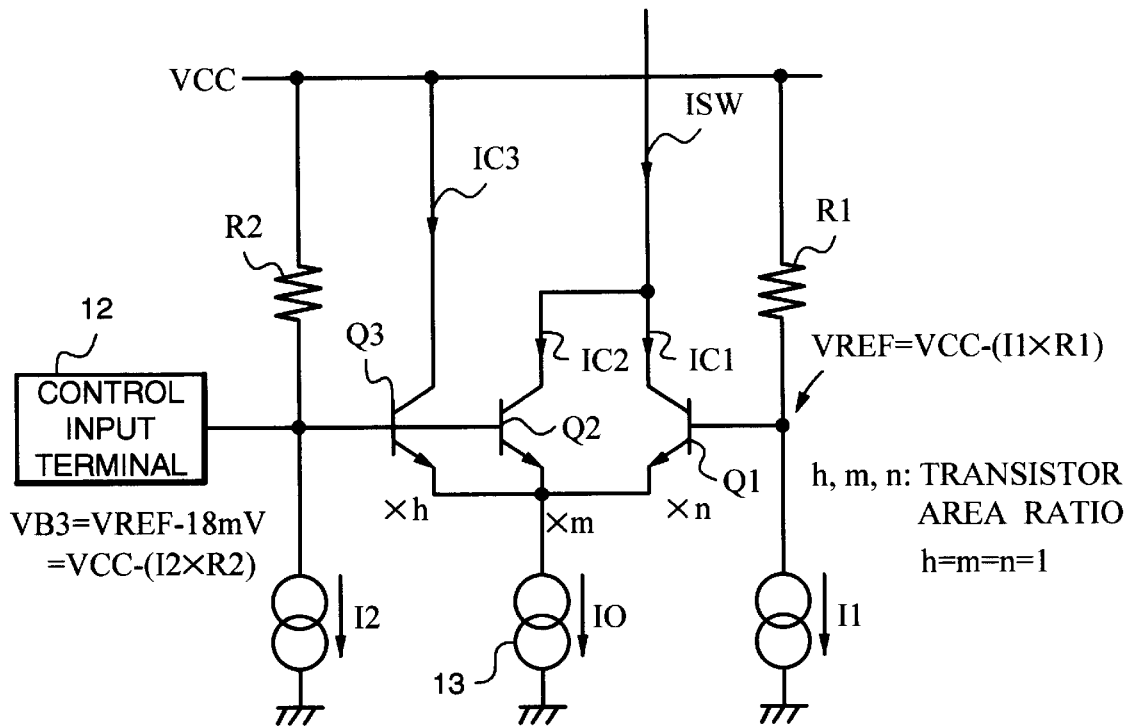
FIG. 9 is a circuit diagram for use in explaining a problem in bias setting at the switching circuit of FIG. 1.
FIG. 10 is a diagram showing a relationship between an input voltage and an output current of the circuit shown in FIG. 9.

FIG. 9 shows a case where an area ratio of transistors Q3, Q2 and Q1 in FIG. 3 is set to be h (Q3):m (Q2):n (Q1)=1:1:1. The switching circuit of FIG. 9, as mentioned above, is an unbalanced differential pair circuit in which transistors Q1, Q2 and Q3 have emitters commonly connected to the constant current source 13 and the transistors Q2 and Q3 have a common base to have a transistor ratio of transistor Q1 to transistors (Q2 and Q3) being 1:2.

FIG. 10 shows values of output current ISW obtained at the output terminal when input to the control input terminal 12 are at a low level L, a high level H and an open HIZ, respectively.

From the above-described expression (3), for setting IC1 to be equal to IC23 (=IC2+IC3), the base voltage VB3 of the transistors Q2 and Q3 should have bias setting 18 mV lower than the base voltage (reference voltage) VREF of the transistor Q1.

For reference, a bias offset voltage value corresponding to a transistor area ratio of the transistor Q1 to the transistors (Q2 and Q3) are shown. With 1:2, a bias offset will be 18 mV, with 1:3, it will be 28.5 mV, with 1:4, it will be 36.0 mV and with 1:5, it will be 41.8 mV.

The switching circuit of FIG. 9 has a disadvantage of complexity disabling the current values I1 and I2 of the constant current sources for determining a bias voltage to be the same and resistors R1 and R2 to be the same.

Figure 11:
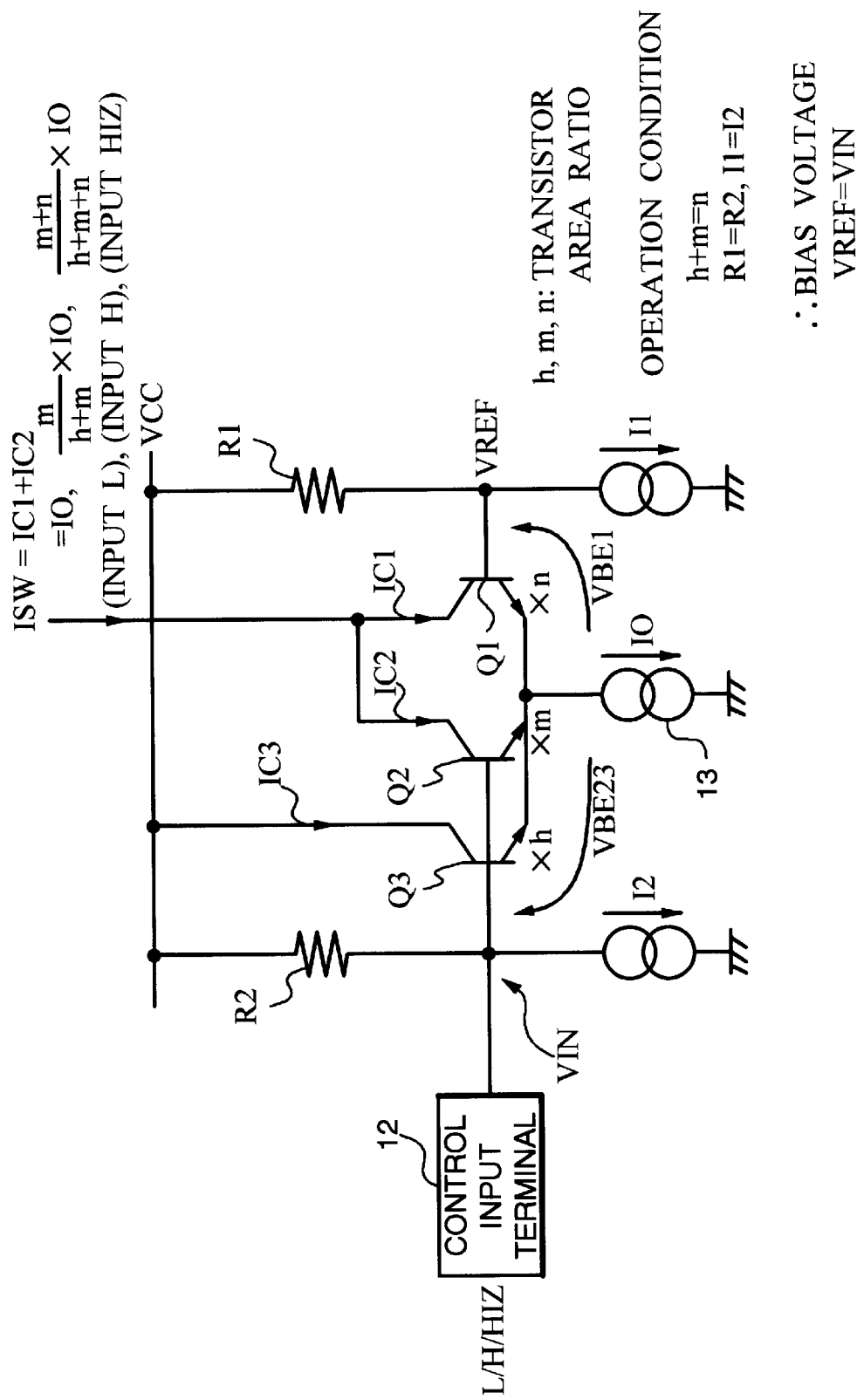
FIG. 11 is a circuit diagram showing structure of a fifth embodiment of the present invention.
Figures 12, 14:
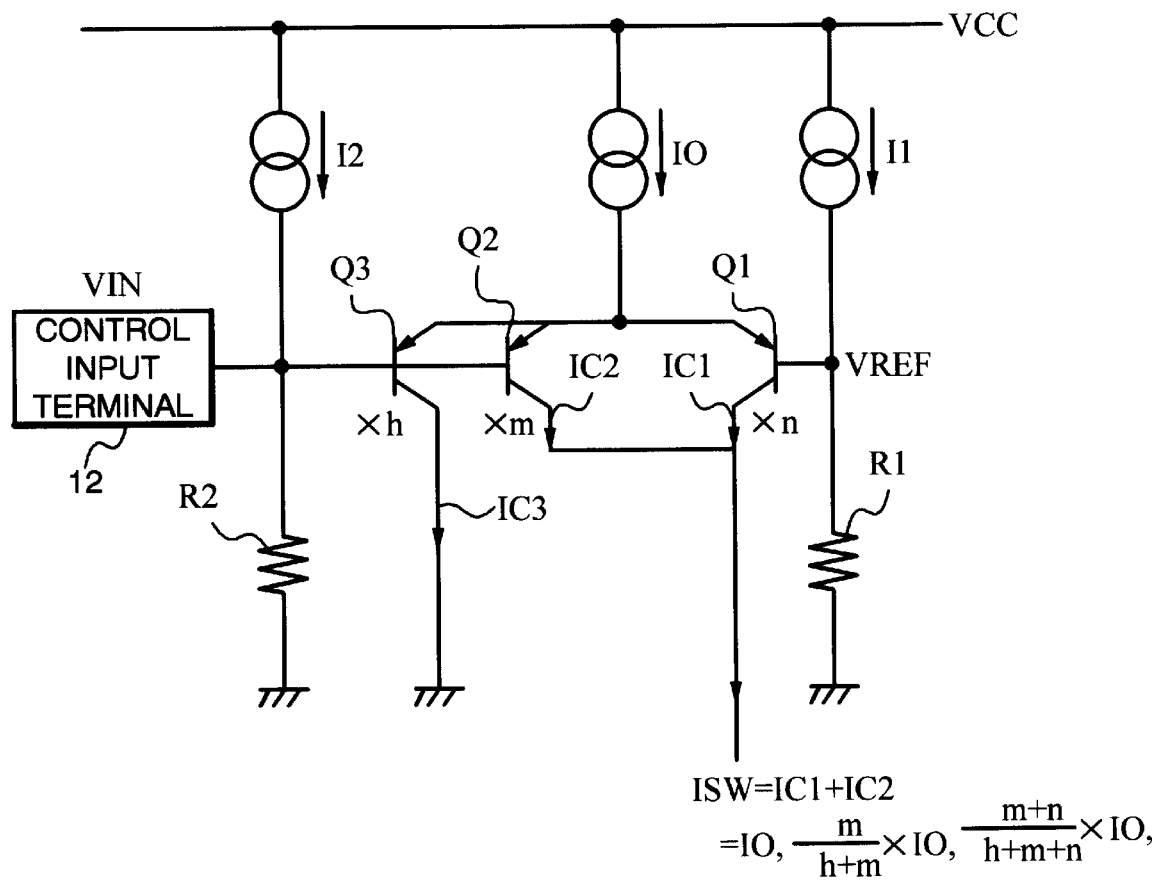
FIG. 12 is a diagram showing a relationship between an input voltage and an output current of the circuit illustrated in FIG. 11.
FIG. 14 is a circuit diagram showing an example of a variation of the circuit shown in FIG. 11.

With reference to FIGS. 11 and 12, a fifth embodiment of the present invention eliminating the above-described disadvantage will be described. In FIG. 11, the present switching circuit has one control input terminal 12 (input voltage VIN) and one output terminal (output current ISW). To the control input terminal 12, three logical values, a low level L, a high level H and an open HIZ are applied. On the other hand, with a current value of the constant current source 13 being IO, an output current ISW of the output terminal provided at a collector terminal side of a transistor Q1 can be IO, $\{m/(h+m)\}\cdot$IO, $\{(m+n)/(h+m+n)\}\cdot$IO because of an area ratio among the transistors Q3, Q2 and Q1 being h:m:n.

It is also assumed here that three logical values of input are obtained from a three-state output buffer.

The present switching circuit is structured such that with respect to an output current ISW=$\{(m+n)/(h+m+n)\}\cdot$IO obtained when input to the control input terminal 12 is at an open HIZ (input voltage VIN=reference voltage VREF), when the low level L and the high level H are applied to the control input terminal 12, the output current ISW variably attains IO and $\{m/(h+m)\}\cdot$IO at equal intervals.

Since a bias voltage setting method of the present switching circuit needs to have the collector currents IC1, IC2 and IC3 of the respective transistors Q1, Q2 and Q3 set to be the same when input logic is at the open HIZ (for changing a current at equal intervals according to input logic), the present embodiment is realized to have a transistor area ratio of h:m:n being h+m=n, to prevent the base-emitter voltages (VBE23 and VBE1) of differential transistors from having a difference and to set the resistors R1 and R2 and the current values I1 and I2 of the constant current sources for determining a bias voltage to be the same, thereby enabling the input voltage VIN to be set equal to the reference voltage VREF by simple structure.

In the following, comparison and description will be made of the switching circuit according to the present embodiment and the switching circuit shown in FIG. 9. For making the two circuits have the same characteristics, employed are the state where an area ratio of the differential transistors in the switching circuit according to the present embodiment is h(Q3):m(Q2):n(Q1)=1:1:2 and the structure of FIG. 9 (transistor area ratio, h:m:n:=1:1:1) requiring an offset bias 18 mV across the differential inputs as mentioned above.

As mentioned above, the switching circuit of FIG. 9 has a disadvantage of complexity disabling the current values I1 and I2 of the constant current sources for determining a bias voltage to be the same and the resistors R1 and R2 to be the same.

On the other hand, for aiming at simplification of a circuit by eliminating the above-described bias offset adjustment, the switching circuit according to the present embodiment is structured to set a transistor area ratio h:m:n of differential transistors Q3, Q2 and Q1 to have a relation of h+m=n, thereby realizing simplification of bias setting.

For making the present embodiment have the same characteristics as those of the switching circuit of FIG. 9, a transistor area ratio h:m:n of the differential transistors Q3, Q2 and Q1 is set be 1:1:2.

Setting the emitter area n of the transistor Q1 to be 2, doubling the term of IS in the expression (1) and lowering the base-emitter voltage VBE1 by 18 mV to have VBE23= VBE1 makes the circuit characteristics of the present switching circuit be the same as those shown in FIG. 9. More specifically, setting a transistor area ratio h:m:n to have h+m=n makes VBE23 equal VBE1 to eliminate adjustment of a voltage offset between the input voltage VIN and the reference voltage VREF, leading to simplification of the circuit design.

In addition, at this bias setting, which is premised on a state where the control input terminal 12 is at the open HIZ, the collector currents IC3, IC2 and IC1 respectively flowing through the transistors Q3, Q2 and Q1 have a relationship of IC1=(IC2+IC1) and the output current ISW is obtained as the expression ISW=IC1+IC2, whereby the value of the output current ISW will be expressed as ISW=(3/4)·IO.

As mentioned above, the characteristic is well known that as an input dynamic range of the differential pair circuit, as long as the input voltage VIN, that is, a difference between the bias voltage and the reference voltage VREF, is not less than 4VT (=100 mV), the entire value of the current source IO flows to one of the IC1 and IC23 (=IC2+IC3) and no current flows to the other as a collector current.

When the base voltage VB3 is not less than reference voltage VREF+100 mV, the collector current IC23 attains IO (IC2=IC3=IO/2) and IC1 attains 0.

Setting a high level H to the control input terminal 13 to be not less than the reference voltage VREF+100 mV results in having the output current ISW being (2/4)·IO from the expression ISW=IC1+IC2.

When the input voltage VIN is not more than the reference voltage VREF−100 mV, the collector current IC23 attains 0 (IC2=IC3=0) and IC1 attains (4/4)·IO. On the other hand, setting a low level L to the control input terminal 13 to be not more than the reference voltage VREF−100 mV will have the output current ISW attaining IO, whereby for three states of input logical values, output is obtained in three states.

Shown here as an example in Table 1 are specific values of the output current ISW corresponding to the input voltage (HIZ, L, H) when the transistors Q3, Q2 and Q1 are assigned a transistor area ratio of h:m:n.

TABLE 1

| h:m:n | IOH | IOZ | IOL | STEP WIDTH |
|---|---|---|---|---|
| 1:1:2 | (2/4)·IO | (3/4)·IO | (4/4)·IO | (1/4)·IO |
| 1:2:3 | (4/6)·IO | (5/6)·IO | (6/6)·IO | (1/6)·IO |
| 1:3:4 | (6/8)·IO | (7/8)·IO | (8/8)·IO | (1/8)·IO |

Assume that an output current when the input voltage is at an open HIZ is IOZ, the output current when the input voltage is at a low level L is IOL and the output current when the input voltage is at a high level H is IOH.

General solution of an output current ISW will be expressed as follows.

$IOZ = \{(m+n)/(h+m+n)\} \cdot IO$ $IOH = \{m/(h+m)\} \cdot IO$ $IOL = IO$ condition of transistor area ratio: $h+m=n$ With the structure of FIG. 9, for adjusting a balance of output currents, an offset voltage is required between the input voltage VIN and the reference voltage VREF, which makes the circuit design complicated because of the need of an offset on the order of several tens mV.

The switching circuit according to the present embodiment, however, enables simplification of bias setting because a bias can be adjusted by a transistor area ratio and also enables the amount of an output current and a step width of an output current corresponding to an input voltage to be changed by variously combining area ratios to expand an application range.

Figure 13:
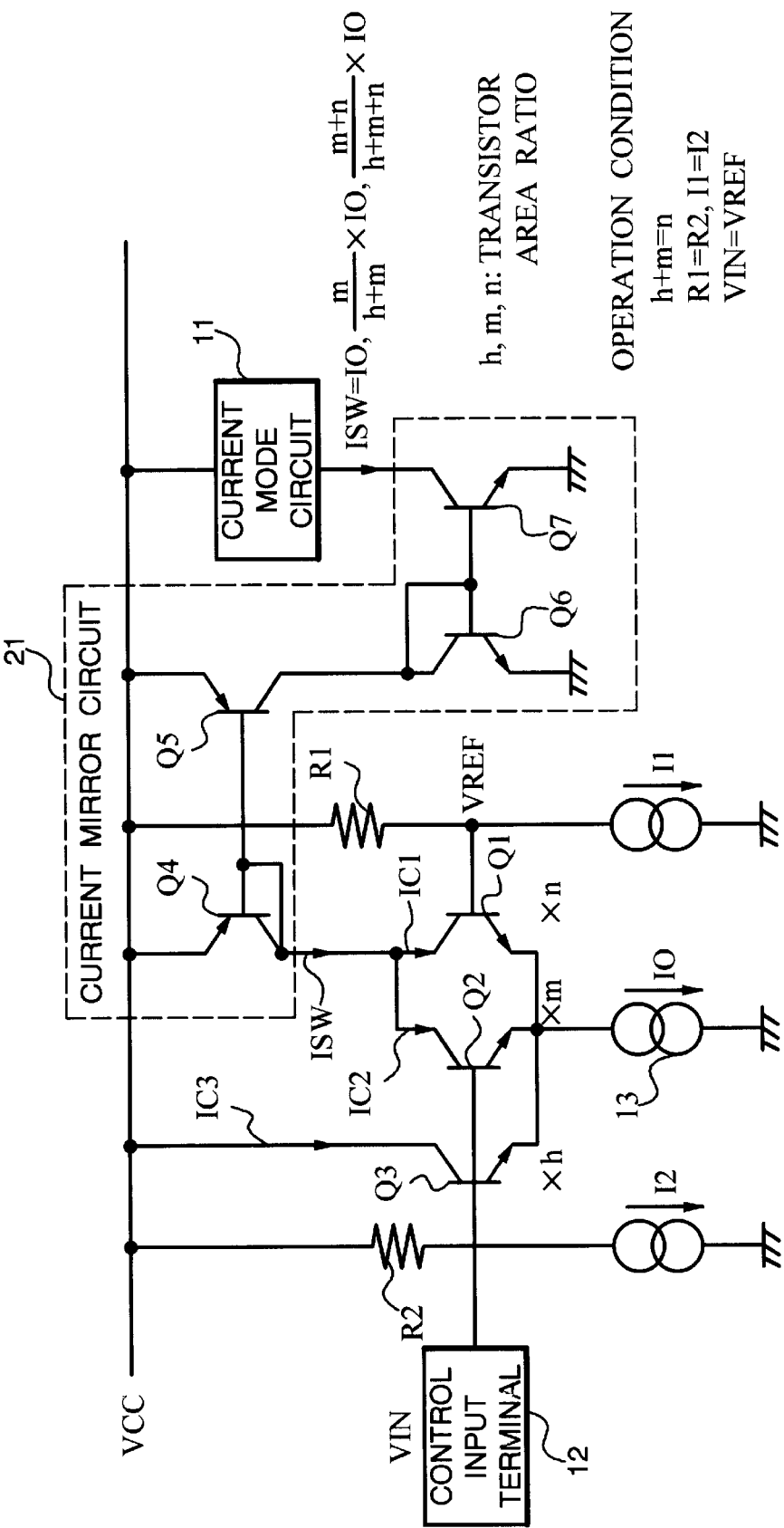
FIG. 13 is a circuit diagram showing structure of a sixth embodiment of the present invention.

With reference to FIG. 13, a sixth embodiment of the present invention will be described. In FIG. 13, the present switching circuit is structured to have the output current ISW of FIG. 11 reflected at a current mirror circuit 21 composed of transistors Q4, Q5, Q6 and Q7 and taken out and supplied to the current mode circuit 11. Shown here is an example of structure employing PNP transistors as the transistors Q4 and Q5 and NPN transistors as the transistors Q6 and Q7.

Figures 15, 17:
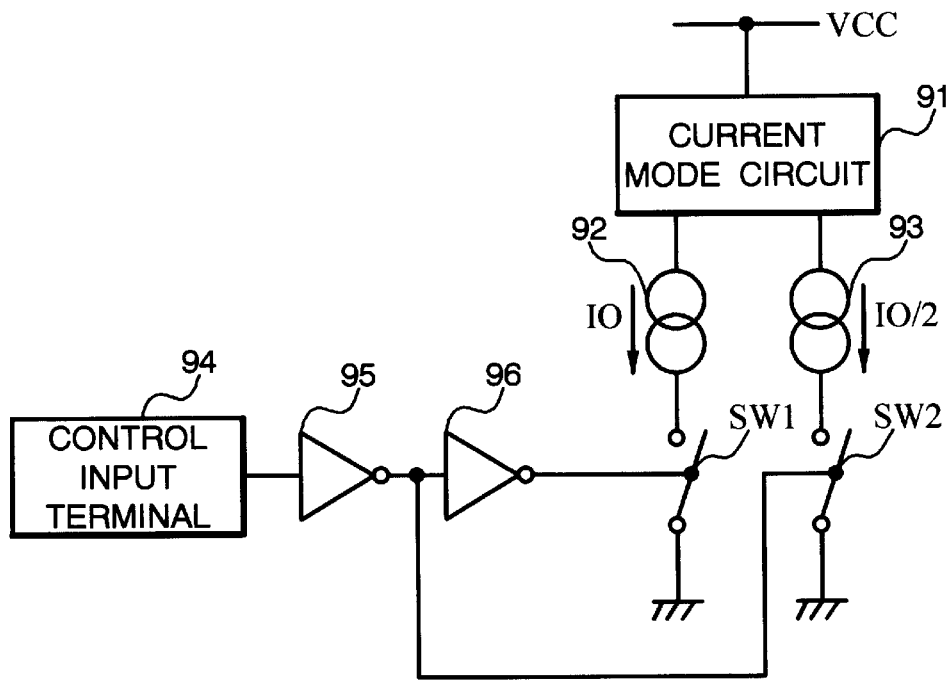
FIG. 15 is a diagram showing a relationship between an input voltage and an output current of the circuit illustrated in FIG. 14.
FIG. 17 is a circuit diagram showing structure of a conventional current switching circuit.

FIG. 14 is an example of a variation of FIG. 11, which is a circuit where the transistors Q1, Q2 and Q3 in the switching circuit of FIG. 11 are all made of a PNP transistor. As illustrated in FIG. 15, a relationship between logic of an input voltage VIN and an output current ISW differs from that of FIG. 11. When an input voltage is at a low level L, the output current ISW attains $\{m/(h+m)\} \cdot IO$. On the other hand, when the input voltage is at a high level H, the output current ISW attains IO. The output current ISW obtained when the input voltage is at an open HIZ is the same as that of FIG. 11.

FIG. 16 shows an example of a variation realized by adding a current mirror circuit 21' to the switching circuit of FIG. 14. More specifically, the variation is structured to have an output current ISW reflected at the current mirror circuit 21' composed of the transistors Q4 and Q5. Shown in particular here is an example using an NMOS transistor as the transistors Q4 and Q5 constituting the current mirror circuit 21'.

As is clear from the foregoing description, while in conventional circuit structure, making a current value variable is realized by switching as many current sources as the variable current values by switches corresponding to the current sources, in the circuit structure of the present invention, three kinds of output currents can be obtained at one output terminal by applying a three-valued logic signal to one control input terminal, thereby operating the characteristics of the current mode circuit to which the output terminal is connected in three modes. In addition, the present invention allows the circuit to be composed of one current source for varying an output current, which structure is effective in integration.

Moreover, under a condition that a transistor area ratio h:m:n among three transistors constituting a differential pair circuit is set to be h+m=n, an offset between a bias voltage at a control input terminal and a reference voltage can be eliminated to eliminate complexity of bias setting.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A three-valued switching circuit, comprising:
    one control input terminal and one output terminal;
    at least two transistors constituting a differential pair; and
    one constant current source connected to a common emitter terminal of the at least two transistors;
    wherein collector of one of said at least two transistors is connected to said output terminal to output three kinds of current values from said output terminal in response to a three-valued logic control signal applied to said control input terminal, and said output terminal is connected to a current mode circuit.

2. The three-valued switching circuit as set forth in claim 1, wherein
    when a current value of said constant current source is IO, said three kinds of current values take one of IO, (1/2)·IO and 0.

3. The three-valued switching circuit as set forth in claim 1, wherein
    a current mirror circuit is connected at the output side to reflect an output current and supply the current to a current mode circuit connected to a terminal of a power source.

4. The three-valued switching circuit as set forth in claim 1, wherein
    when a current value of said constant current source is IO, said three kinds of current values take one of IO, (1/2)·IO and 0, and
    a current mirror circuit is connected at the output side to reflect an output current and supply the current to a current mode circuit connected to a terminal of a power source.

5. The three-valued switching circuit as set forth in claim 1, wherein
    one transistor is added to said two transistors constituting a differential pair to make three-transistor structure,
    all emitters of said three transistors are connected to said constant current source, the other of said two transistors and the additional transistor have bases commonly connected to said control input terminal, a base of one of said two transistors is connected to a reference voltage source, and a collector of said one transistor and a collector of said additional transistor are commonly connected to said output terminal.

6. The three-valued switching circuit as set forth in claim 1, wherein one transistor is added to said two transistors constituting a differential pair to make three-transistor structure, all emitters of said three transistors are connected to said constant current source, the other of said two transistors and the additional transistor have bases commonly connected to said control input terminal, a base of one of said two transistors is connected to a reference voltage source, a collector of said one transistor and a collector of said additional transistor are commonly connected to said output terminal, and a current mirror circuit is connected at the output side to reflect an output current and supply the current to a current mode circuit connected to a terminal of a power source.

7. The three-valued switching circuit as set forth in claim 1, wherein one transistor is added to said two transistors constituting a differential pair to make three-transistor structure, all emitters of said three transistors are connected to said constant current source, the other of said two transistors and the additional transistor have bases commonly connected to said control input terminal, a base of one of said two transistors is connected to a reference voltage source, a collector of said one transistor and a collector of said additional transistor are commonly connected to said output terminal, and when a current value of said constant current source is IO, said three kinds of current values take one of IO, (3/4)·IO and (1/2)·IO.

8. The three-valued switching circuit as set forth in claim 1, wherein one transistor is added to said two transistors constituting a differential pair to make three-transistor structure, all emitters of said three transistors are connected to said constant current source, the other of said two transistors and the additional transistor have bases commonly connected to said control input terminal, a base of one of said two transistors is connected to a reference voltage source, a collector of said one transistor and a collector of said additional transistor are commonly connected to said output terminal, a current mirror circuit is connected at the output side to reflect an output current and supply the current to a current mode circuit connected to a terminal of a power source, and when a current value of said constant current source is IO, said three kinds of current values take one of IO, (3/4)·IO and (1/2)·IO.

9. The three-valued switching circuit as set forth in claim 1, wherein one transistor is added to said two transistors constituting a differential pair to make three-transistor structure, all emitters of said three transistors are connected to said constant current source, the other of said two transistors and the additional transistor have bases commonly connected to said control input terminal, a base of one of said two transistors is connected to a reference voltage source, a collector of said one transistor and a collector of said additional transistor are commonly connected to said output terminal, and a transistor ratio of said three transistors is arbitrarily changed like A: B: C: (A, B and C are integers) to take out an output current value.

10. The three-valued switching circuit as set forth in claim 1, wherein one transistor is added to said two transistors constituting a differential pair to make three-transistor structure, all emitters of said three transistors are connected to said constant current source, the other of said two transistors and the additional transistor have bases commonly connected to said control input terminal, a base of one of said two transistors is connected to a reference voltage source, a collector of said one transistor and a collector of said additional transistor are commonly connected to said output terminal, a current mirror circuit is connected at the output side to reflect an output current and supply the current to a current mode circuit connected to a terminal of a power source, and a transistor ratio of said three transistors is arbitrarily changed like A: B: C: (A, B and C are integers) to take out an output current value.

11. The three-valued switching circuit as set forth in claim 1, wherein a third transistor Q2 is added to said first and second transistors constituting a differential pair to make three-transistor structure, all emitters of said three transistors are connected to said constant current source, said first or second transistor and said third transistor have bases commonly connected to said control input terminal, a base of one of said first and second transistors is connected to a reference voltage source, a collector of said first or second transistor and a collector of said third transistor are commonly connected to said output terminal, and an area ratio of said third, second and first transistors represented as h:m:n is set to have a relationship of h+m=n.

12. The three-valued switching circuit as set forth in claim 1, wherein a third transistor Q2 is added to said first and second transistors constituting a differential pair to make three-transistor structure, all emitters of said three transistors are connected to said constant current source, said first or second transistor and said third transistor have bases commonly connected to said control input terminal, a base of one of said first and second transistors is connected to a reference voltage source, a collector of said first or second transistor and a collector of said third transistor are commonly connected to said output terminal, an area ratio of said third, second and first transistors represented as h:m:n is set to have a relationship of h+m=n, and an input voltage to said control input terminal and a bias voltage value of said reference voltage source are set to be equal.

13. The three-valued switching circuit as set forth in claim 1, wherein a third transistor Q2 is added to said first and second transistors constituting a differential pair to make three-transistor structure, all emitters of said three transistors are connected to said constant current source, said first or second transistor and said third transistor have bases commonly connected to said control input terminal, a base of one of said first and second transistors is connected to a reference voltage source, a collector of said first or second transistor and a collector of said third transistor are commonly connected to said output terminal, an area ratio of said third, second and first transistors represented as h:m:n is set to have a relationship of h+m=n, and a current mirror circuit is connected at the output side to reflect an output current and supply the current to a current mode circuit connected to a power source VCC terminal.

* * * * *